US012672267B2

(12) United States Patent
Yang et al.

(10) Patent No.: US 12,672,267 B2
(45) Date of Patent: Jun. 30, 2026

(54) POWER MODULE ASSEMBLY

(71) Applicant: Delta Electronics, Inc., Taoyuan City (TW)

(72) Inventors: Kaijian Yang, Shanghai (CN); Shaojun Chen, Shanghai (CN); Xi Liu, Shanghai (CN); Quansong Luo, Shanghai (CN)

(73) Assignee: Delta Electronics, Inc., Taoyuan City (TW)

( * ) Notice: Subject to any disclaimer, the term of this patent is extended or adjusted under 35 U.S.C. 154(b) by 478 days.

(21) Appl. No.: 18/203,191

(22) Filed: May 30, 2023

(65) Prior Publication Data

US 2023/0397382 A1     Dec. 7, 2023

(30) Foreign Application Priority Data

Jun. 2, 2022   (CN) .......................... 202210625665.6

(51) Int. Cl.
*H05K 7/20*          (2006.01)

(52) U.S. Cl.
CPC ......... *H05K 7/209* (2013.01); *H05K 7/20463* (2013.01); *H05K 7/20509* (2013.01)

(58) Field of Classification Search
CPC .............. H05K 7/209; H05K 7/20463; H05K 7/20509; H02M 1/00; H01L 23/367
USPC ....................................................... 361/709
See application file for complete search history.

(56) References Cited

U.S. PATENT DOCUMENTS

| | | | | |
|---|---|---|---|---|
| 6,653,730 | B2 * | 11/2003 | Chrysler ............. | H01L 23/3732 |
| | | | | 257/E23.101 |
| 2004/0057214 | A1 * | 3/2004 | Alcoe ..................... | H01L 23/42 |
| | | | | 257/E23.101 |
| 2011/0057713 | A1 * | 3/2011 | Kawanami ............. | H01L 25/16 |
| | | | | 361/728 |
| 2017/0092561 | A1 * | 3/2017 | Eid ...................... | H01L 21/4878 |
| 2021/0329809 | A1 * | 10/2021 | Jin ......................... | H05K 1/141 |

FOREIGN PATENT DOCUMENTS

| | | | | | |
|---|---|---|---|---|---|
| CN | 111064344 | A | | 4/2020 | |
| CN | 113161309 | A | | 7/2021 | |
| CN | 113270379 | A * | 8/2021 | ......... | H05K 7/20445 |
| EP | 2779230 | B1 * | 1/2019 | ....... | H01L 23/49503 |
| JP | 2009117701 | A | | 5/2009 | |
| JP | 2017099035 | A | | 6/2017 | |

* cited by examiner

*Primary Examiner* — Mandeep S Buttar
*Assistant Examiner* — Kyle Oxenknecht
(74) *Attorney, Agent, or Firm* — KIRTON McCONKIE; Evan R. Witt

(57) ABSTRACT

A power module assembly is disposed on a substrate and dissipates heat generated through the substrate. The power module assembly includes a circuit board, a heat-generating device, a first metal block, a first filling material and a second filling material. The circuit board includes at least one plane. The heat-generating device is disposed on the plane. The first metal block includes a first side and a second side. The first side of the first metal block faces the heat-generating device, and the second side of the first metal block faces the substrate. The first filling material is disposed between the first side of the first metal block and the heat-generating device. The second filling material is disposed between the second side of the first metal block and the substrate.

20 Claims, 11 Drawing Sheets

POWER MODULE ASSEMBLY

CROSS-REFERENCE TO RELATED APPLICATION

This application claims priority to China Patent Application No. 202210625665.6, filed on Jun. 2, 2022. The entire contents of the above-mentioned patent application are incorporated herein by reference for all purposes.

FIELD OF THE INVENTION

The present disclosure relates to a power module assembly.

BACKGROUND OF THE INVENTION

High-power DC/DC power modules are widely used in the fields such as telephone communications, data centers, and supercomputers. However, with the rapid development of fixed-line network and mobile communication, the requirements for output power and efficiency of the high-power DC/DC power modules are getting higher and higher. On the other hand, with the trend of miniaturization of communication products, it is necessary to increase the efficiency of the power module used and reduce the volume at the same time, so as to increase the power density. Therefore, the heat dissipation problem of the high-power DC/DC power modules under high power density is getting worse, and its design for heat dissipation is also becoming more and more complicated.

In order to solve the heat dissipation problem under high power density, the contacts of thermal pads, thermal adhesives and heat sinks are used in most of the conventional power module assemblies. Furthermore, the plastic molding technology is used to package the power modules into a whole in a small number of the conventional power module assemblies, and then the thermal pad or the thermal adhesive is used in contact with the heat sink for transferring the heat. However, the above two methods have the problems of complex heat sink processing or high threshold of power module manufacturing process, which increases the cost of the power module product and causes a delay in time of the power module product to market.

Therefore, there is a need of providing a power module assembly for obviating the drawbacks encountered by the prior arts.

SUMMARY OF THE INVENTION

An object of the present disclosure is to provide a power module assembly.

In accordance with an aspect of the present disclosure, a power module assembly is provided. The power module assembly is disposed on a substrate for dissipating heat generated from the power module assembly. The power module assembly includes a circuit board, at least one heat-generating device, a first metal block, a first filling material and a second filling material. The circuit board includes at least one plane The at least one heat-generating device is disposed on the at least one plane. The first metal block includes a first side and a second side. The first side of the first metal block faces the at least one heat-generating device, and the second side of the first metal block faces the substrate. The first filling material is disposed between the first side of the first metal block and the at least one heat-generating device. The second filling material is disposed between the second side of the first metal block and the substrate.

In accordance with another aspect of the present disclosure, a power module assembly is provided and includes a circuit board, at least one heat-generating device, a first filling material and a second metal block. The circuit board includes at least one plane. The at least one heat-generating device is disposed on the at least one plane. The first metal block includes a first side and a second side. The first side of the first metal block faces the at least one heat-generating device, and the second side of the first metal block faces a substrate. The first filling material is disposed between the first side of the first metal block and the at least one heat-generating device. The second metal block includes a first end and a second end. The first end is connected to the at least one plane, the second end is flat and coplanar with the second side of the first metal block, and configured to connect to an installation plane of the substrate.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
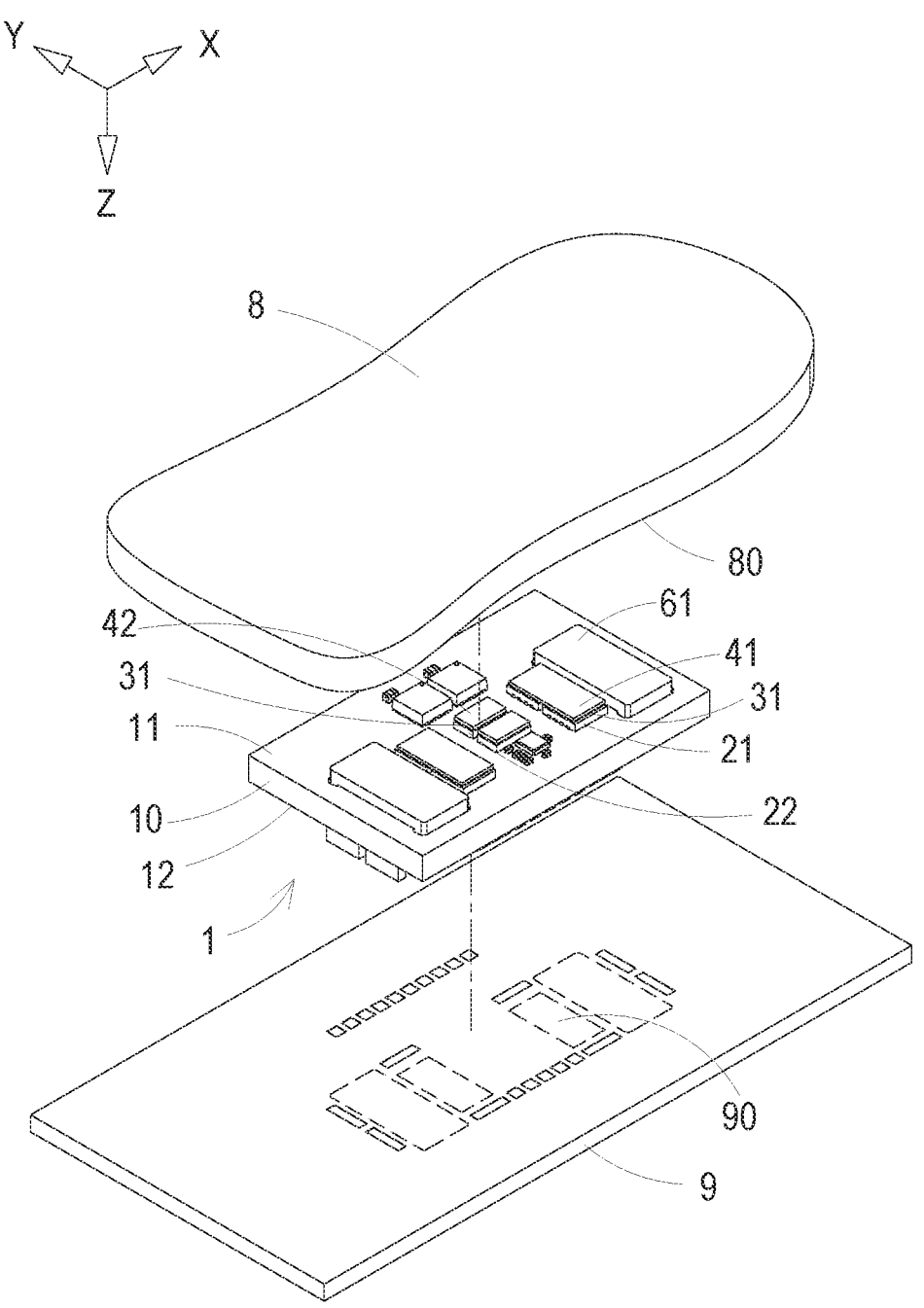
FIG. 1 is an exploded view illustrating a power module assembly and an applicable substrate according to a first embodiment of the present disclosure.

The present disclosure will now be described more specifically with reference to the following embodiments. It is to be noted that the following descriptions of embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "below," "under," "lower," "over," "upper" and the like, may be used herein for ease of describing one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements described in the respective embodiments may be expressed by the different reference numerals. These terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items.

Figure 2:
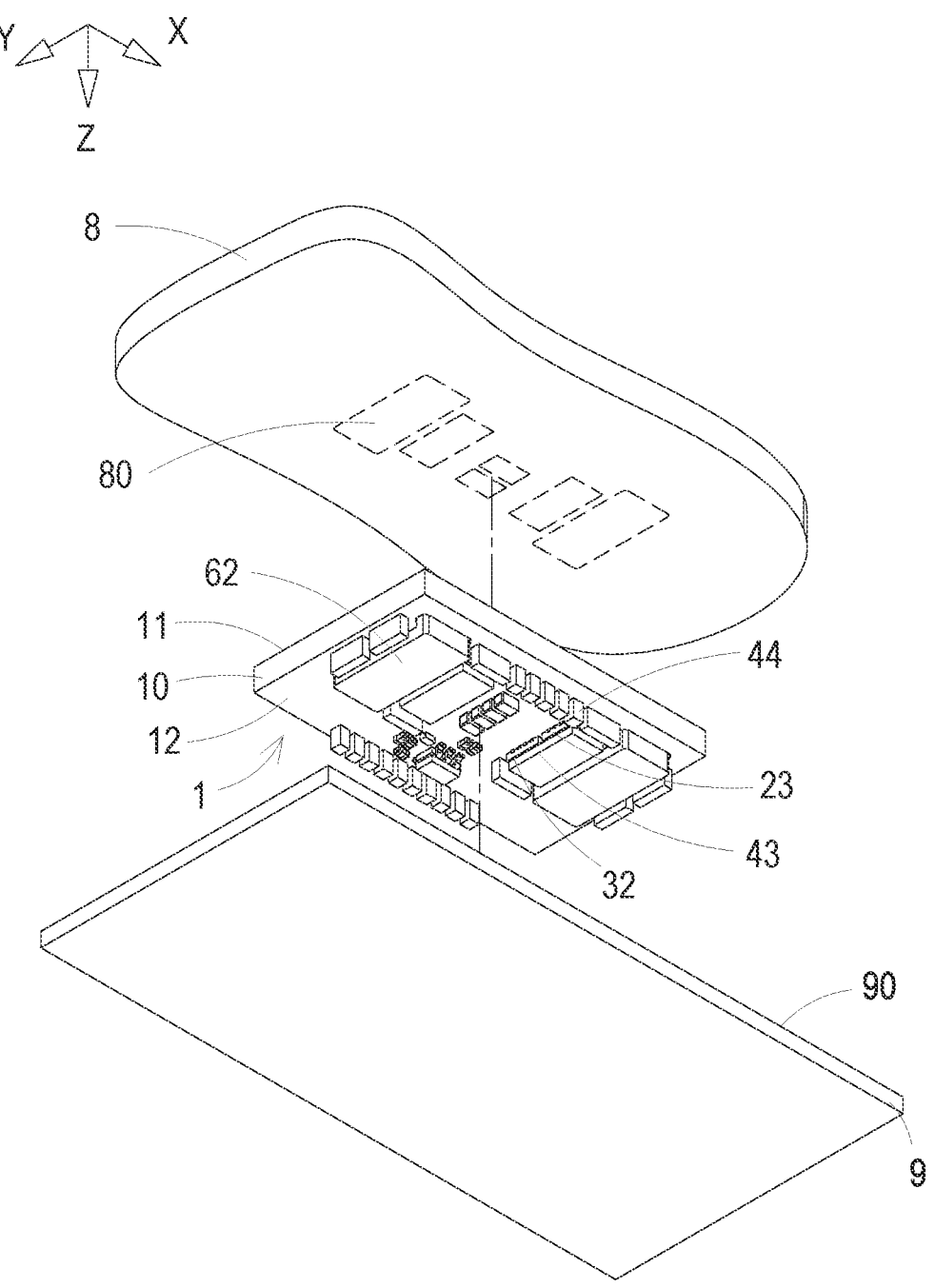
FIG. 2 is an exploded view illustrating the power module assembly and the substrate according to the first embodiment of the present disclosure and taken from another perspective.
Figure 3:
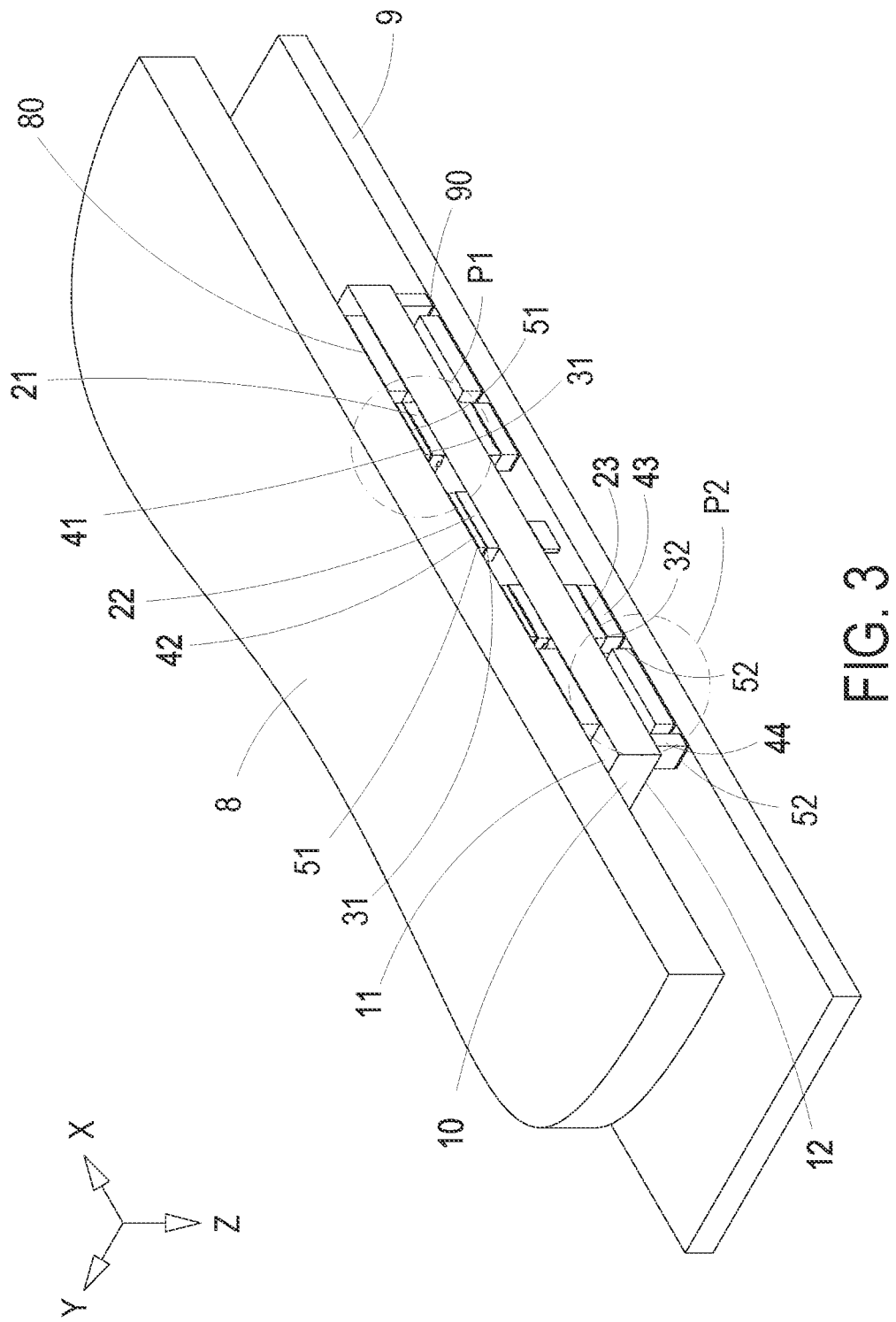
FIG. 3 is a cross sectional structure illustrating the power module assembly and the substrate according to the first embodiment of the present disclosure.

FIG. 1 and FIG. 2 are exploded views illustrating a power module assembly and an applicable substrate according to a first embodiment of the present disclosure. FIG. 3 is a cross sectional structure illustrating the power module assembly and the substrate according to the first embodiment of the present disclosure. As shown in FIG. 1, FIG. 2 and FIG. 3, the power module assembly 1 of the present disclosure can be for example but not limited to a DC/DC power module assembly, which is configured to be disposed on a heat sink 8 or a substrate of a system board 9. The heat generated from the power module assembly 1 is dissipated through the substrate and the heat sink. In the embodiment, the power module assembly 1 includes a circuit board 10, at least one heat-generating device 21, 22, 23, a first metal block 41, 42, 43, a first filling material 31, 32 and a second filling material 51, 52. The circuit board 10 includes a first plane 11 and a second plane 12 opposite to each other. The at least one heat-generating device 21, 22 is disposed on the first plane 11, and connected to the substrate of the heat sink 8 through the first filling material 31, the corresponding first metal block 41, 42 and the second filling material 51 in sequence. In addition, the at least one heat-generating device 23 is disposed on the second plane 12, and connected to the substrate of the system board 9 through the first filling material 32, the corresponding first metal block 43 and the second filling material 52 in sequence. In the embodiment, the first metal blocks 41, 42 are stacked on at least one heat-generating device 21, 22 carried by the circuit board 10 through the first filling material 31, and the second filling material 51 is stacked on the first metal blocks 41, 42, so that a stacking height on the first plane 11 of the circuit board 10 can be optimized. Furthermore, the first metal block 43 is stacked on at least one heat-generating device 23 carried by the circuit board 10 through the first filling material 32, and the second filling material 52 is stacked on the first metal block 43, so that a stacking height on the second plane 12 of the circuit board 10 can be optimized. Its detailed structure will be described respectively as follows.

Figure 4A:
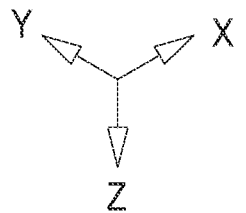
FIGS. 4A and 4B show an example of combining the power module assembly with a heat sink served as the substrate according to the first embodiment of the present disclosure.
Figure 4A:
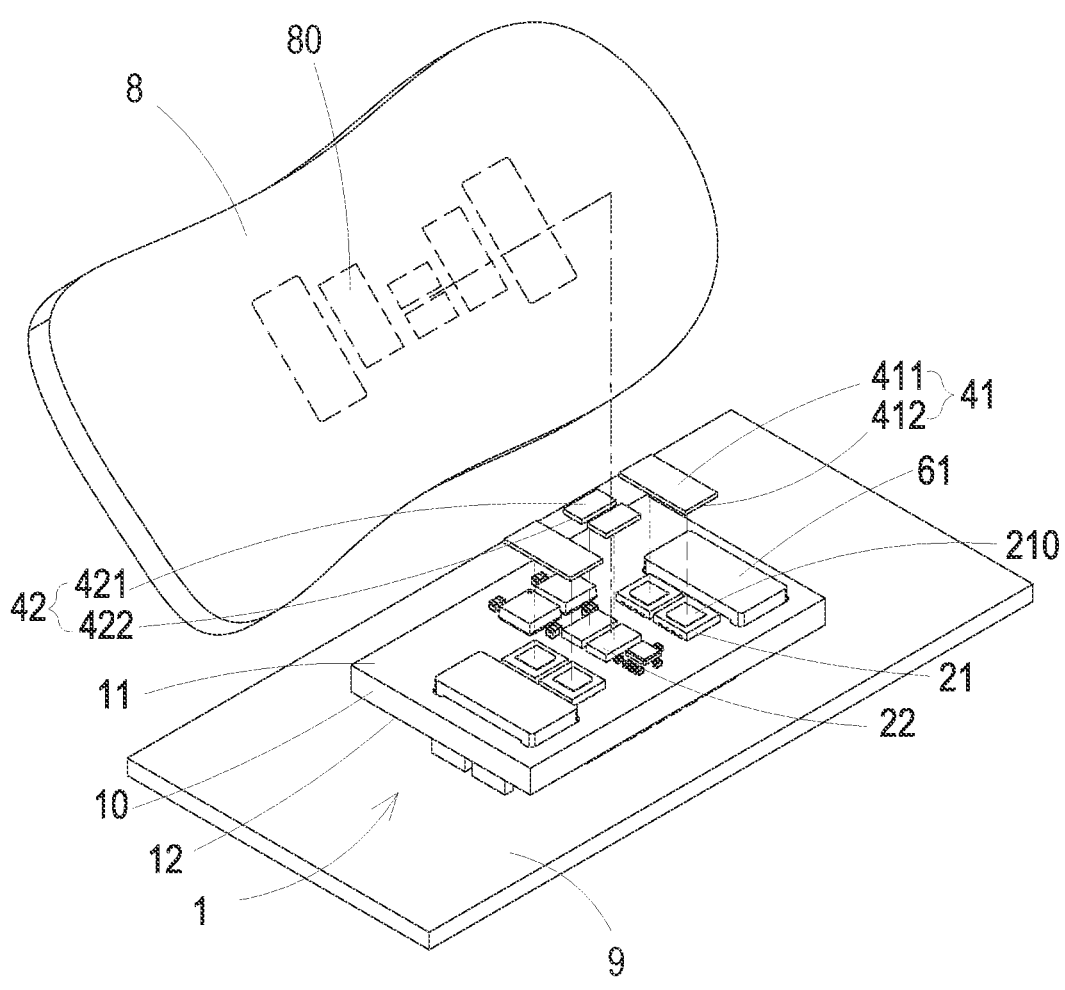
Figure 4B:
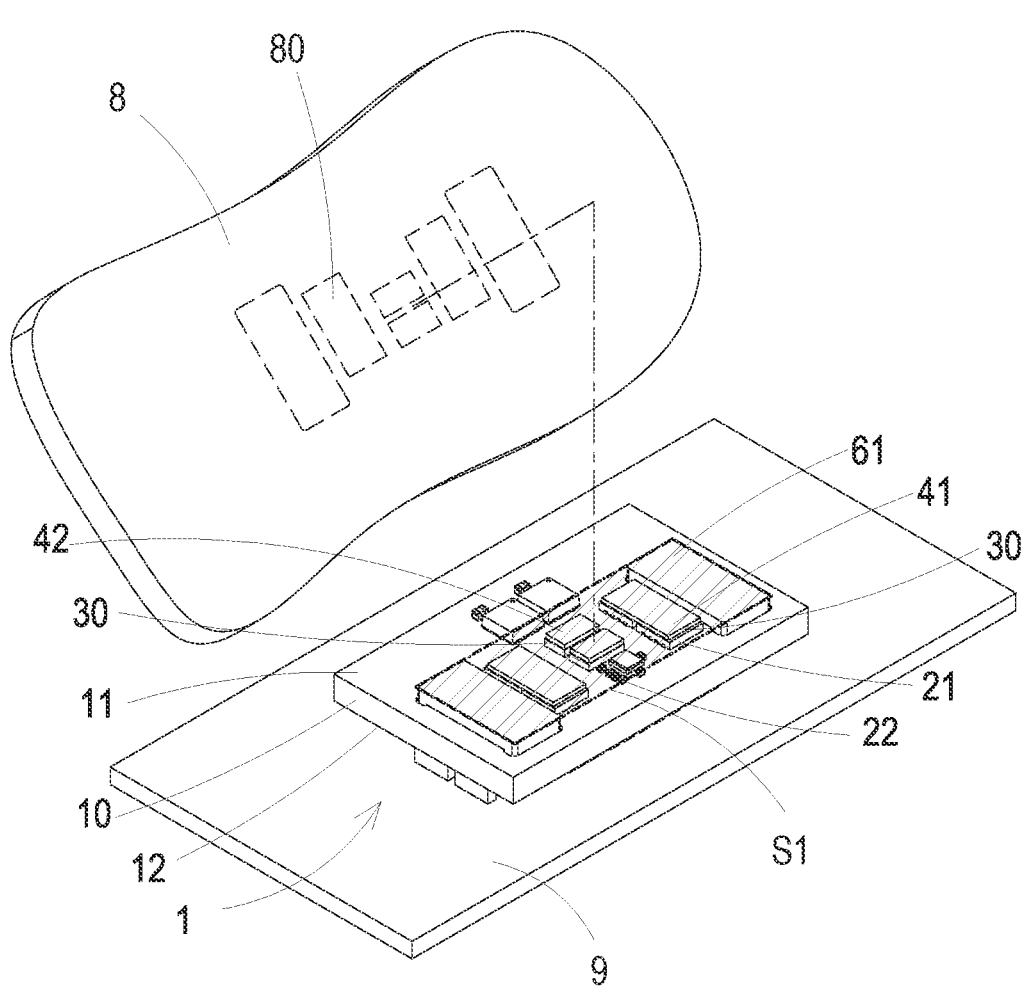
Figure 5:
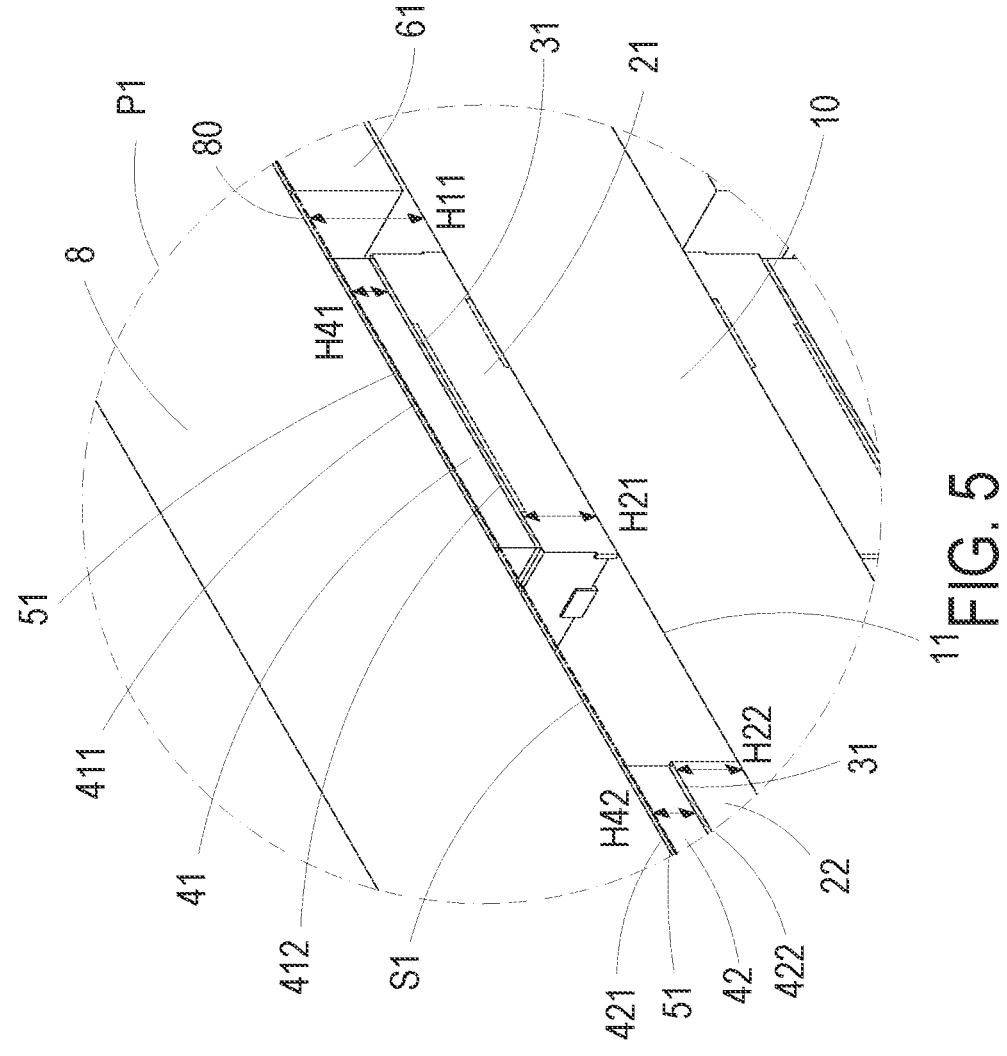
FIG. 5 is an enlarged view of the region P1 in FIG. 3.

FIGS. 4A and 4B show an example of combining the power module assembly with a heat sink served as the substrate according to the first embodiment of the present disclosure. FIG. 5 is an enlarged view of the region P1 in FIG. 3. Please refer to FIGS. 1 to 5. In the embodiment, the heat sink 8 served as the substrate includes an installation plane 80 facing the first plane 11 of the circuit board 10 and connected and fixed to the power module assembly 1. The heat-generating devices 21, 21 with the different heights are disposed on the first plane 11 of the circuit board 10 of the power module assembly 1. Preferably but not exclusively, the heat-generating devices 21, 22 are disposed on the first plane 11 of the circuit board 10 by soldering. However, it is not an essential technical feature of the present disclosure and not redundantly described herein. In the embodiment, the heat-generating device 21 has a height H21 relative to the first plane 11, and the heat-generating device 22 has a height H22 relative to the first plane 11. In addition, other large-sized metal blocks or electronic components are further arranged on the first plane 11 of the circuit board 10. Generally, the heights of these metal blocks or electronic components are different from the heights of the heat-generating devices 21, 22. Preferably but not exclusively, the magnetic component 61 has a maximum height H11 relative to the first plane 11. In the embodiment, the height H21 of the heat-generating device 21 and the height H22 of the heat-generating device 22 are both smaller than the maximum height H11. In the embodiment, the first metal block 41 includes a first side 412 and a second side 411 opposite to each other. The first side 412 of the first metal block 41 faces the heat-generating device 21 and is stacked on the heat-generating device 21 through the first filling material 31. There is a height H41 formed between the first side 412 and the second side 411 of the first metal block 41. When the first metal block 41 is stacked on the heat-generating device 21 through the first filling material 31, the second side 411 of the first metal block 41 forms the maximum height H11 relative to the first plane 11. Similarly, in the embodiment, the first metal block 42 includes a first side 422 and a second side 421 opposite to each other. The first side 422 faces the heat-generating device 22 and is stacked on the heat-generating device 22 through the first filling material 31. There is a height H42 formed between the first side 422 and the second side 421 of the first metal block 42. When the first metal block 42 is stacked on the heat-generating device 22 through the first filling material 31, the second side 421 of the first metal block 42 forms the maximum height H11 relative to the first plane 11. Moreover, in other embodiments, the large-sized electronic components such as the magnetic component 61 is disposed on the first plane 11 and has a maximum height H11 relative to the first plane 11, so that the heat-generating devices 21, 22, the corresponding first filling material 31 and the corresponding first metal blocks 41, 42 have a total height equal to the maximum height H11. In other words, the first metal blocks 41, 42 with different heights are stacked on the corresponding heat-generating devices 21, 22 through the first filling material 31, so that the stacking height on the first plane 11 of the circuit board 10 can be optimized and for example fits with the maximum height H11. It makes the second side 411 of the first metal block 41, the second side 421 of the first metal block 42 and a top surface of other large-sized electronic components such as the magnetic component 61 collaboratively form a uniform coplanar plane S1. It facilitates the power module assembly 1 to be fixed on the installation plane 80 of the heat sink 8 through the second filling material 51, so as to optimize the fixing and thermal coupling between the power module assembly 1 and the heat sink 8, reduce the design complexity of the heat sink 8, and improve the heat dissipation configuration of the DC/DC power module. At the same time, the heat dissipation capability of the power module assembly 1 is enhanced, and the overall power density is improved. Preferably but not exclusively, in the embodiment, the height H41 of the first metal block 41 and the height H42 of the first metal block 42 are larger than 0.2 mm, so as to facilitate the stacking operation and provide sufficient heat dissipation performance. Certainly, the present disclosure is not limited thereto.

Preferably but not exclusively, in the embodiment, the heat-generating device 21 is a switch device in a Dual-Side Cooling (DSC) package, which includes a metal surface 210 corresponding to the surface of the first metal block 41. The metal surface 210 is used for heat dissipation, and also served as a pin of the switch device for external electrical connection. Preferably but not exclusively, in the embodiment, the first filling material 31 is a conductive glue or a solder. Preferably but not exclusively, in an embodiment, the solder served as the first filling material 31 is coated on the heat-generating device 21 firstly, the first metal block 41 is stacked thereon, and then a reflow soldering process is performed to complete the connection between the heat-generating device 21 and the first metal block 41. Certainly, the present disclosure is not limited thereto. In an embodiment, the heat-generating device 21 in the DSC package has the metal surface 210 for heat dissipation merely. By disposing the thermal adhesive served as the first filling material 31 between the heat-generating device 21 and the first metal block 41, the first side 412 of the first metal block 41 is fixed on the heat-generating device 21. The second side 411 of the first metal block 41 is attached to the installation plane 80 of the heat sink 8 through the thermal adhesive served as the second filling material 51. In that, the heat generated from the heat-generating device 21 is transferred to the heat sink 8 through the first metal block 41. In another embodiment, the heat-generating device 21 in the DSC package has the metal surface 210 for heat dissipation and served as the pin of the heat-generating device 21. At this time, the heat-generating device 21 is electrically and/or thermally connected to the exterior through the first metal block 41. The conductive glue served as the first filling material 31 is disposed between the heat-generating device 21 and the first metal block 41, and the first side 412 of the first metal block 41 is fixed on the heat-generating device 21, so that the electrical and thermal connections are formed between the heat-generating device 21 and the first metal block 41. Furthermore, the second side 411 of the first metal block 41 is attached to the installation plane 80 of the heat sink 8 through the thermal adhesive served as the second filling material 51, so that the heat generated by the heat-generating device 21 is transferred to the heat sink 8 through the first metal block 41. When the first metal block 41 is electrically connected to the pin of the heat-generating device 21 through the first filling material 31, and two heat-generating devices 21 are switch devices in the DSC package and disposed adjacent to each other, it allows to provide the electrical connection through single first metal block 41. Preferably but not exclusively, the two adjacent switch devices in the DSC package are electrically connected in series or in parallel through the first metal block 41. In other embodiments, the heat-generating device 22 is a plastic-encapsulated component with a surface of a plastic-encapsulating material, and there is no need for electrical connection. Preferably but not exclusively, the first filling material 31 is a thermal adhesive or an adhesive glue, and the heat-generating device 22 is thermally coupled to the first side 422 of the first metal block 42. In addition, the fixing and connection between the coplanar plane S1 of the power module assembly 1 and the installation plane 80 of the heat sink 8 is realized through the second filling material 51. In other embodiments, the first filling material 31 and the second filling material 51 can be for example but not limited to a conductive glue, a solder, a thermal adhesive or an adhesive glue. The first metal blocks 41, 42 can be for example but not limited to copper blocks, aluminum blocks, which are with low thermal resistance and high thermal conductivity. The present disclosure is not limited thereto. Compared with the thermal pads or thermal glue used in the conventional solution, the first metal blocks 41, 42 used in the present disclosure can greatly reduce the thermal resistance of the contact interface, and the height of the first metal blocks 41, 42 can be flexibly adjustable and designed according to the practical requirements.

Please refer to FIGS. 1 to 5. The two heat-generating devices 21 arranged adjacently share one first metal block 41. In another embodiment, each heat-generating device 21 corresponds to one first metal block 41 independently. Each heat-generating device 22 corresponds to one first metal block 42 independently. In another embodiment, two adjacent heat-generating devices 22 share one first metal block 42. In other embodiments, a plurality of heat-generating devices 21 arranged adjacently share one first metal block 41. In the embodiment, the heat-generating device 21 is for example a switch device in a dual-side cooling (Dual-Side Cooling, DSC) package, and the metal surface of the heat-generating device 21 is served as a pin of the switch device. Preferably but not exclusively, the plurality of switch devices can be electrically connected in parallel through the first metal block 41. A plurality of heat-generating devices 22 arranged adjacently can share one first metal block 42.

Figure 6A:
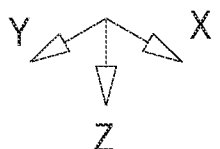
FIGS. 6A and 6B show another example of combining the power module assembly with a system board served as the substrate according to the first embodiment of the present disclosure.
Figure 6A:
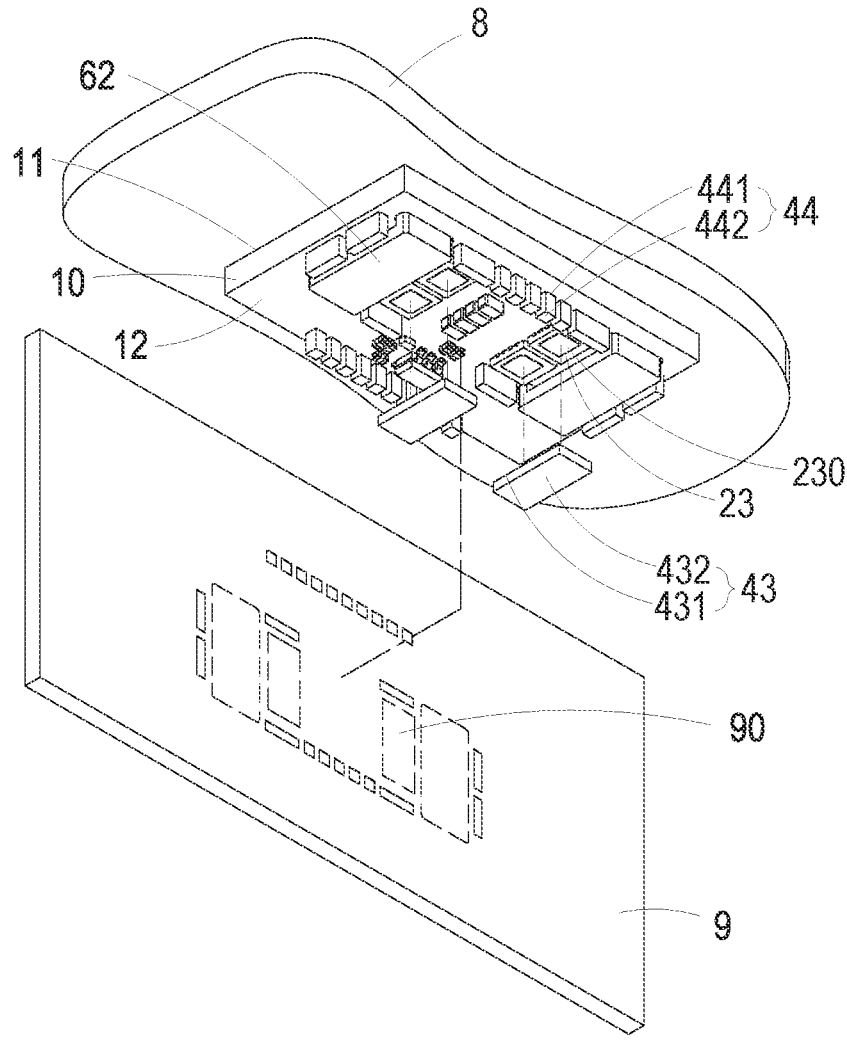
Figure 6B:
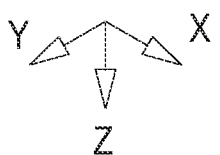
Figure 6B:
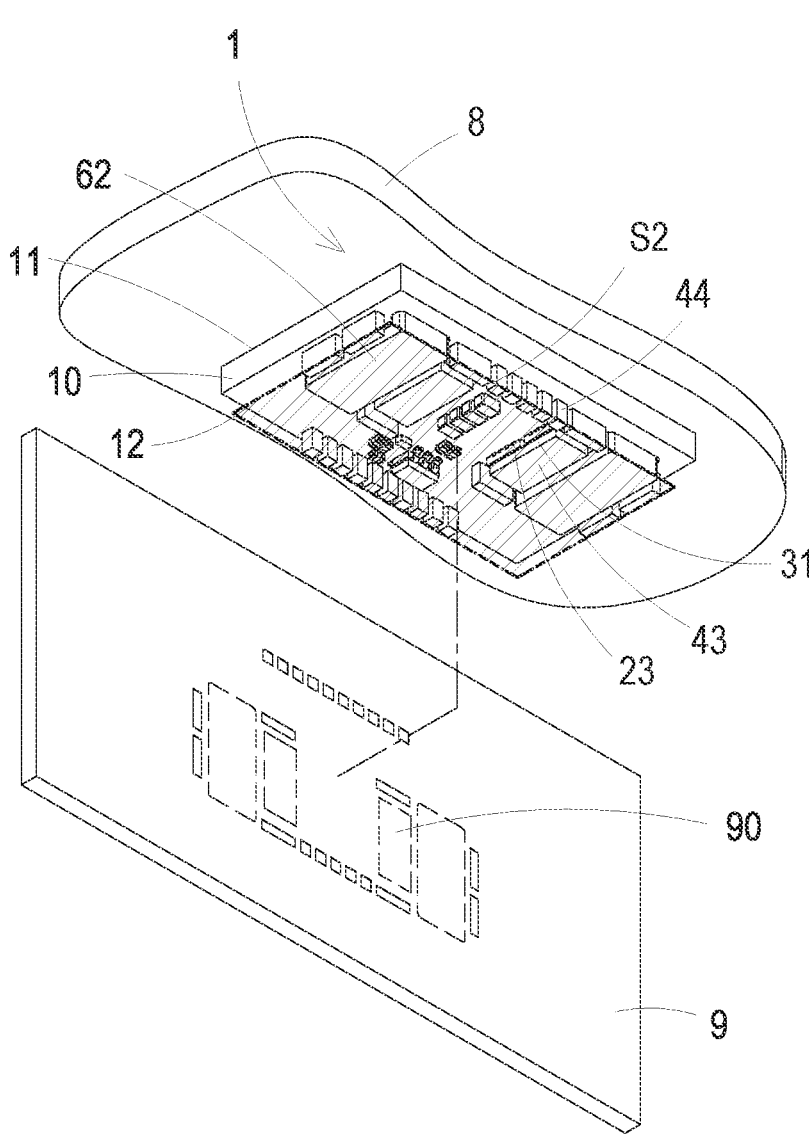
Figure 7:
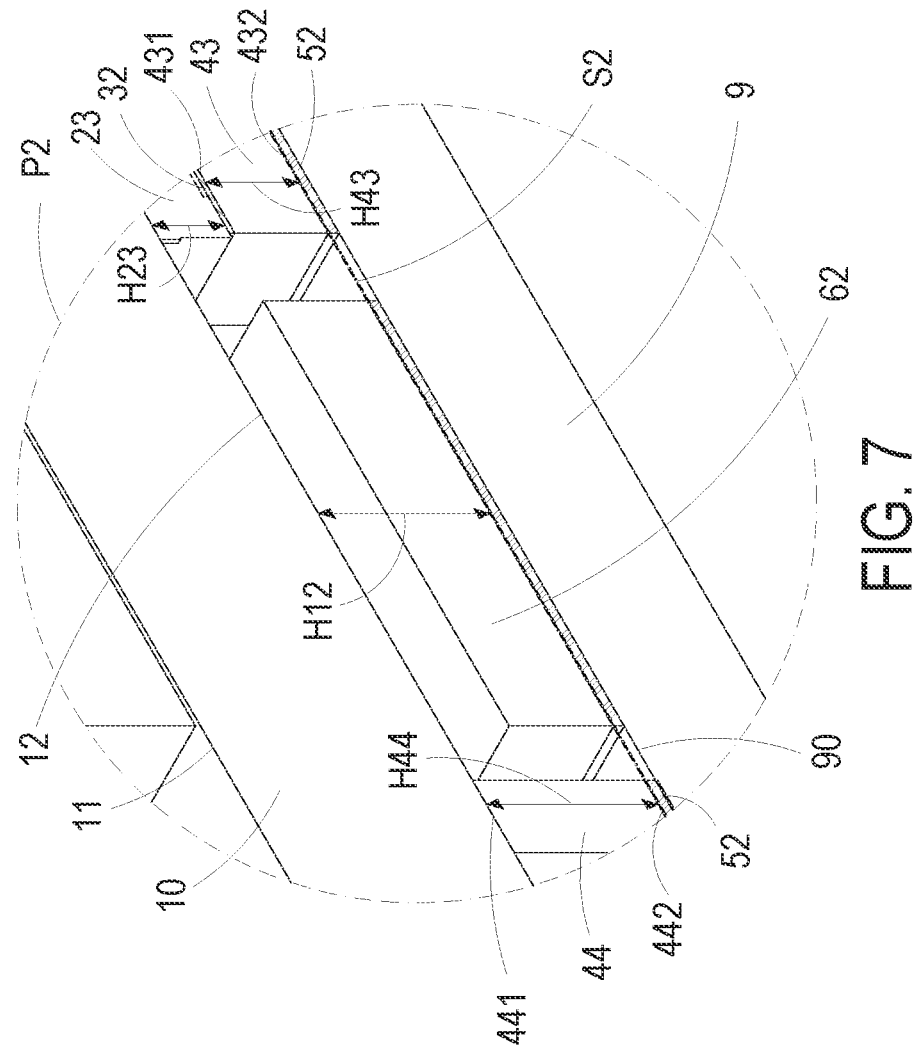
FIG. 7 is an enlarged view of the region P2 in FIG. 3.

FIGS. 6A and 6B show another example of combining the power module assembly with a system board served as the substrate according to the first embodiment of the present disclosure. FIG. 7 is an enlarged view of the region P2 in FIG. 3. Please refer to FIGS. 1 to 3 and FIGS. 6A to 7. In the embodiment, the system board 9 served as the substrate includes an installation plane 90 facing the second plane 12 of the circuit board 10 and is connected and fixed to the power module assembly 1. At least one heat-generating device 23 is disposed on the second plane 12 of the circuit board 10. In the embodiment, the heat-generating device 23 has a height H23 relative to the second plane 12. The first metal block 43 includes a first side 431 and a second side 432 opposite to each other. The first side 431 of the first metal block 43 faces the at least one heat-generating device 23 correspondingly, and the second side 432 of the first metal block 43 faces the installation plane 90 of the system board 9. The first filling material 32 is disposed between the first side 431 of the first metal block 43 and the at least one heat-generating device 23. In the embodiment, a plurality of second metal blocks are further disposed on the second plane 12 of the circuit board 10 of the power module assembly 1. Preferably but not exclusively, the heat-generating device 23 and the second metal blocks 44 are disposed on the second plane 12 of the circuit board 10 by soldering. In the embodiment, each of the second metal blocks 44 has a first end 441 and a second end 442 opposite to each other. The first end 441 is connected to the second plane 12 of the circuit board 10. In addition, each of the second ends 442 of the second metal blocks 44 has a height H44 relative to the second plane 12. Moreover, the large-sized metal blocks or electronic components are further disposed on the second plane 12 of the circuit board 10. Generally, the height of the large-sized metal blocks or electronic components is different from the height of the heat-generating device 23. Preferably but not exclusively, the magnetic assembly 62 has a maximum height H12 relative to the second plane. 12. In the embodiment, the height H44 of the second metal block 44 is equal to the maximum height H12. In the embodiment, the height difference between the second metal block 44 and the at least one heat-generating device 23 relative to the second plane 12 is greater than 0.2 mm. That is, the height H44—the height H23>0.2 mm. It facilitates the stacking operation of the first metal block 23 and provide sufficient heat dissipation performance. Moreover, in the embodiment, the first metal block 43 includes the first side 431 and the second side 432 opposite to each other. The first side 431 of the first metal block 43 faces the heat-generating device 23 and is stacked on the heat-generating device 23 through the first filling material 32. There is a height H43 formed between the first side 431 and the second side 432. Preferably but not exclusively, the height H43 is greater than 0.2 mm. In the embodiment, when the first block 43 is stacked on the heat-generating device 23 through the first filling material 32, the second side 432 of the first metal block 43 forms the maximum height H12 relative to the second plane 12. Furthermore, in the embodiment, the large-sized electronic components such as the magnetic component 62 is disposed on the second plane 12 and has a maximum height H12 relative to the second plane 12, so that the heat-generating device 23, the corresponding first filling material 32 and the corresponding first metal block 43 have a total height equal to the maximum height H12. In other words, the second end 442 of the second metal block 44, the second side 423 of the first metal block 43 and a top surface of the magnetic component 62 collaboratively form a uniform coplanar plane S2. It facilitates the power module assembly 1 to be fixed on the installation plane 90 of the system board 9 through the second filling material 52, so as to optimize the fixing and thermal coupling between the power module assembly 1 and the system board 9, increase multiple applications of heat-dissipation paths and electrical connections, and simplify the heat dissipation configuration of the DC/DC power module. At the same time, the heat dissipation capability of the power module assembly 1 is enhanced, and the overall power density is improved.

Preferably but not exclusively, in the embodiment, the heat-generating device 23 is a switch device in a Dual-Side Cooling (DSC) package, which includes a metal surface 230 corresponding to the surface of the first metal block 43. The metal surface 230 is used for heat dissipation, and also served as a pin of the switch device for external electrical connection. Preferably but not exclusively, in the embodiment, the first filling material 32 is a conductive glue or a solder. In an embodiment, the heat-generating device 23 in the DSC package has the metal surface 230 for heat dissipation merely. By disposing the thermal adhesive served as the first filling material 32 between the heat-generating device 23 and the first metal block 43, the first side 431 of the first metal block 43 is fixed on the heat-generating device 22. The second side 432 of the first metal block 43 is attached to the installation plane 90 of the system board 9 through the thermal adhesive served as the second filling material 52. In that, the heat generated from the heat-generating device 23 is transferred to the system board 9 through the first metal block 43. In another embodiment, the heat-generating device 23 in the DSC package has the metal surface 230 for heat dissipation and served as the pin of the heat-generating device 23. At this time, the heat-generating device 23 is electrically and/or thermally connected to the exterior through the first metal block 43. The conductive glue served as the first filling material 32 is disposed between the heat-generating device 23 and the first metal block 43, and the first side 431 of the first metal block 43 is fixed on the heat-generating device 23, so that the electrical and thermal connections are formed between the heat-generating device 23 and the first metal block 43. Furthermore, the second side 432 of the first metal block 43 is attached to the installation plane 90 of the system board 9 through the thermal adhesive served as the second filling material 52, so that the heat generated by the heat-generating device 23 is transferred to the system board 9 through the first metal block 43. Preferably but not exclusively, in an embodiment, the second side 432 of the first metal block 43 is attached to the installation plane 90 of the system board 9 through the conductive adhesive or the solder served as the second filling material 52. In that, the heat generated by the heat-generating device 23 is transferred to the system board 9 through the first metal block 43. At the same time, the heat-generating device 23 is electrically connected to the substrate of the system board 9 through the first filling material 32, the first metal block 43 and the second filling material 52. When the first metal block 43 is electrically connected to the pin of the heat-generating device 23 through the first filling material 32, and two heat-generating devices 23 are switch devices in the DSC package and disposed adjacent to each other, it allows to provide the electrical connection through single first metal block 43. Preferably but not exclusively, the two adjacent switch devices in the DSC package are electrically connected in series or in parallel through the first metal block 43. In other embodiments, the heat-generating device 23 is a plastic-encapsulated component with a surface of a plastic-encapsulating material, and there is no need for electrical connection. Preferably but not exclusively, the first filling material 32 is a thermal adhesive or an adhesive glue, and the heat-generating device 23 is thermally coupled to the first side 431 of the first metal block 43. In addition, the fixing and connection between the coplanar plane S2 of the power module assembly 1 and the installation plane 90 of the system board 9 is realized through the second filling material 52. In other embodiments, the first filling material 32 and the second filling material 52 can be for example but not limited to a conductive glue, a solder, a thermal adhesive or an adhesive glue. The first metal block 43 can be for example but not limited to copper blocks, aluminum blocks, which are with low thermal resistance and high thermal conductivity. The present disclosure is not limited thereto. Compared with the thermal pads or thermal glue used in the conventional solution, the first metal block 43 used in the present disclosure can greatly reduce the thermal resistance of the contact interface, and the height of the first metal block 43 can be flexibly adjustable and designed according to the practical requirements.

Please refer to FIGS. 6A to 7. The two heat-generating devices 23 arranged adjacently share one first metal block 43. In another embodiment, each heat-generating device 23 corresponds to one first metal block 43 independently. In other embodiments, a plurality of heat-generating devices 23 arranged adjacently share one first metal block 43. In the embodiment, the heat-generating device 23 is for example a switch device in a DSC package, and the metal surface of the heat-generating device 23 is served as a pin of the switch device. Preferably but not exclusively, the plurality of switch devices can be electrically connected in parallel through the first metal block 43.

In the above-mentioned embodiments, "equal to the maximum height", "form the maximum height", "form a uniform coplanar plane" and "coplanar" etc., are not strictly equal or coplanar. For example, the errors existing in actual engineering are allowed. Unless otherwise specified in the implementation, the error range is generally allowed within 20%, preferably within 10%, and more preferably within 5%. Within the error range allowed by manufacturing engineering, such slight changes will not influence the essential features of the present disclosure.

Figure 8:
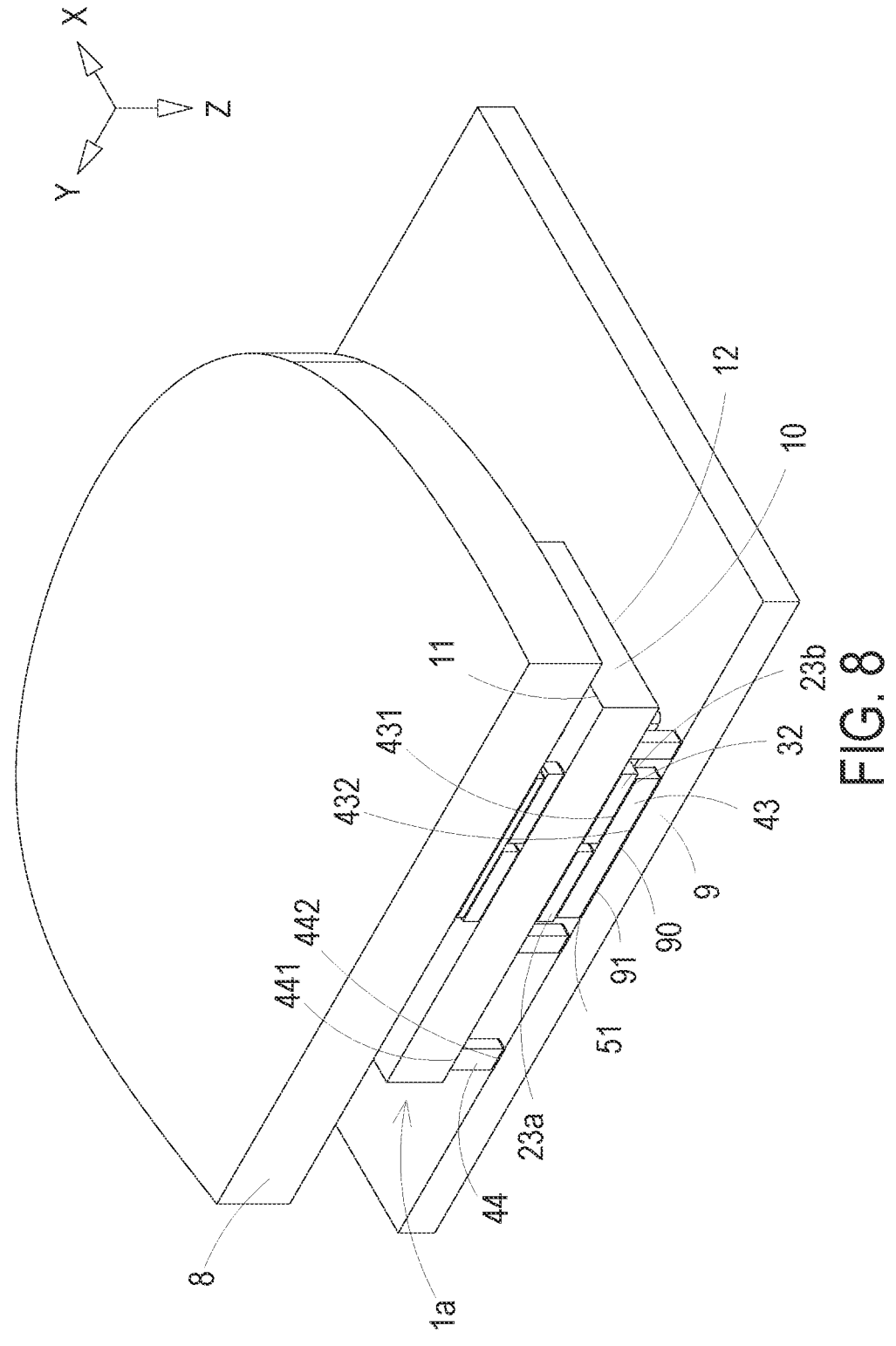
FIG. 8 is a cross sectional structure illustrating a power module assembly and an applicable substrate according to a second embodiment of the present disclosure.

FIG. 8 is a cross sectional structure illustrating a power module assembly and an applicable substrate according to a second embodiment of the present disclosure. In the embodiment, the structures, elements and functions of the power module assembly 1a are similar to those of the power module assembly 1 of FIGS. 1 to 7, and are not redundantly described herein. In the embodiment, the power module assembly 1a further includes two heat-generating devices 23a, 23b disposed adjacent to each other and connected to the first metal block 43 through the first filling material 32. In the embodiment, the installation plane 90 of the system board 9 has a leading-connection area 91, for example but not limited to soldering pads. Preferably but not exclusively, the first filling material 32 and the second filling material 52 are the solder or the conductive glue. The two heat-generating devices 23a, 23b are both DSC switch devices, and electrically connected in parallel to the leading-connection area 91 of the system board 9 through the first filling material 32, the first metal block 43 and the second filling material 52. In this way, the first metal block 43 stacked on the heat-generating devices 23a, 23b provides the functions of heat transfer and electrical connection from the heat-generating devices 23a, 23b to the system board 9, so that the fixing and connection of the power module assembly 1 to the system board 9 and the parallel applications are achieved. Certainly, the present disclosure is not limited thereto.

Figure 9:
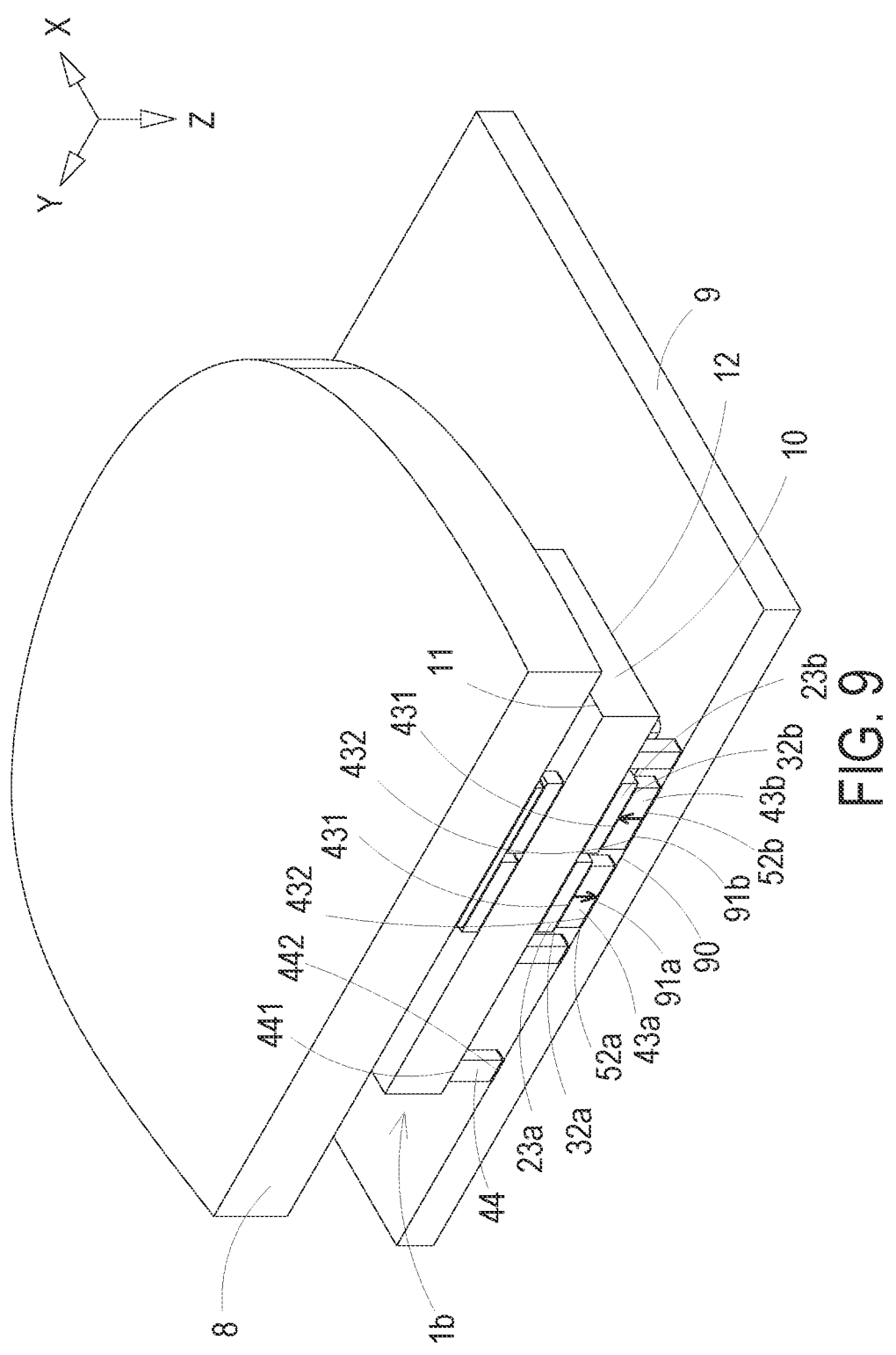
FIG. 9 is a cross sectional structure illustrating a power module assembly and an applicable substrate according to a third embodiment of the present disclosure.

FIG. 9 is a cross sectional structure illustrating a power module assembly and an applicable substrate according to a third embodiment of the present disclosure. In the embodiment, the structures, elements and functions of the power module assembly 1b are similar to those of the power module assembly 1 of FIGS. 1 to 7, and are not redundantly described herein. In the embodiment, the power module assembly 1b further includes two heat-generating devices 23a, 23b disposed adjacent to each other. Preferably but not exclusively, the two heat-generating devices 23a, 23b are DSC switch devices. In the embodiment, the heat-generating device 23a is electrically connected to the leading-connection area 91a of the system board 9 through the first filling material 32a, the first metal block 43a and the second filling material 52a. The heat-generating device 23b is electrically connected to the leading-connection area 91b of the system board 9 through the first filling material 32b, the first metal block 43b and the second filling material 52b. In other words, the two heat-generating devices 23a, 23b are electrically connected to the system board 9 through two independent first metal blocks 43a, 43b respectively. It should be noted that the first metal block 43a and the first metal block 43b have current in opposite directions. When the currents of the first metal block 43a and the first metal block 43b are equal in magnitude but opposite in direction, the magnetic force lines generated by the currents can partially cancel each other out, so as to solve EMI problems. Certainly, the present disclosure is not limited thereto.

It should be emphasized that in the power module assemblies 1, 1a, 1b of the present disclosure, the heat-generating devices 21, 22, 23 are for example but not limited to switch devices, magnetic devices or metal blocks for electrical connection or heat dissipation. Moreover, the first filling material 31, 32 and the second filling material 51, 52 are one selected from the group consisting of a conductive glue, a solder, a thermal adhesive and an adhesive glue. The first filling material 31, 32 and the second filling material 51, 52 may be different. In other words, the formations of the coplanar planes S1, S2 of the power module assemblies 1, 1a, 1b implemented through the first metal blocks 21, 22, 23 and the first filling materials 31, 31, and the fixing and connection between the power module assemblies 1, 1a, 1b, the heat sink 8 and the system board 9 through the second filling materials 51, 52 are adjustable according to the practical requirements. The present disclosure is not limited thereto, and not redundantly described herein.

The present disclosure provides a power module assembly, and the power module assembly at least has the following advantages. By stacking a metal block on at least one heat-generating device carried on the circuit board through the filling material, it allows to optimize the stacking height on the at least one plane of the circuit board to form a uniform coplanar plane with other large-sized metal blocks or electronic components. It is beneficial for the power module assembly to be further assembled and fixed on a substrate, such as a system board or a heat sink board through the filling materials, so as to optimize the fixing and connection of the power module assembly to the system board, reduce the design complexity of the heat sink, and improve the heat dissipation configuration of the DC/DC power module. At the same time, the heat dissipation capability of the power module assembly is enhanced, and the overall power density is improved. By stacking a metal block on at least one heat-generating device, it allows to flatten a plurality of metal blocks in the power module assembly to form a coplanar plane. It facilitates to simplify the process of assembling and fixing the power supply assembly to a heat sink and a system board, so that the purposes of saving labor, reducing production costs and improving the reliability of the power module assembly are achieved. On the other hand, when the heat-generating device is a switch device in a Dual-Side Cooling (DSC) package, the metal block stacked on the heat-generating device further provides a thermally and/or electrically connecting from the heat-generating device to the system board. Two of the heat-generating devices can be fixed and connected to the system board in parallel through single metal block. In case of that two of the heat-generating devices are electrically connected to the system board through two independent metal blocks, it allows to control the two independent metal blocks to have current in opposite directions, so as to solve the EMI problem of the power module. Furthermore, with a plurality of metal blocks flattened on a coplanar plane, the process of assembling and fixing the power module assembly to the heat sink and the system board is simplified, and the compressive capacity and the support capacity of the power module assembly are further enhanced. The size of the heat dissipation devices in the overall assembly structure is reduced, the heat dissipation capability of the power module assembly is enhanced, and the purpose of improving the overall power density is achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module assembly disposed on a substrate for dissipating heat generated from the power module assembly, wherein the power module assembly comprises:

a circuit board comprising at least one plane;

at least one heat-generating device disposed on the at least one plane;

at least one first metal block comprising a first side and a second side, wherein the first side of the first metal block faces the at least one heat-generating device, and the second side of the first metal block faces the substrate, wherein each one of the at least one first metal block substantially thermally contacts a corresponding one of the at least one heat-generating device, wherein a projection of each one of the at least one first metal block on the at least one plane overlaps a projection of the corresponding heat-generating device on the at least one plane, and does not overlap a projection of another heat-generating device on the at least one plane;

a first filling material disposed between the first side of the first metal block and the at least one heat-generating device, and a second filling material disposed between the second side of the first metal block and the substrate.

2. The power module assembly according to claim 1, wherein the substrate is a system board, and the first metal block is connected to a leading-connection area of the system board through the second filling material, wherein the second filling material is a conductive glue, a solder, a thermal adhesive or an adhesive glue.

3. The power module assembly according to claim 1, wherein the at least one heat-generating device comprises two heat-generating devices commonly connected to the first metal block through the first filling material.

4. The power module assembly according to claim 3, wherein the two heat-generating devices are dual-side cooling switch devices and connected in parallel through the first metal block and the first filling material, and the first metal block is thermally and/or electrically connected to a system board through the second filling material.

5. The power module assembly according to claim 1, wherein the at least one heat-generating device comprises two heat-generating devices arranged adjacent to each other, wherein the two heat-generating devices are dual-side cooling switch devices, one of the two heat-generating devices is electrically connected to the substrate through the first metal block, the other of the two heat-generating devices is electrically connected to the substrate through another first metal block, and two the first metal blocks have current in opposite directions.

6. The power module assembly according to claim 1, further comprising a second metal block having a first end connected to the at least one plane of the circuit board, and a second end connected to the substrate through the second filling material.

7. The power module assembly according to claim 6, wherein a height difference formed between the second metal block and the at least one heat-generating device relative to the at least one plane is greater than 0.2 mm.

8. The power module assembly according to claim 6, wherein the second end of the second metal block is flat and coplanar with the second side of the first metal block.

9. The power module assembly according to claim 6, wherein the substrate is a system board, the first metal block and the second metal block are electrically connected to an installation plane of the system board through the second filling material, wherein the second filling material is a conductive glue, a solder, a thermal adhesive or an adhesive glue.

10. The power module assembly according to claim 6, wherein the substrate is a heat sink, and the first metal block and the second metal block are fixed and connected to an installation plane of the heat sink through the second filling material, wherein the second filling material is a thermal adhesive or an adhesive glue.

11. The power module assembly according to claim 1, wherein the substrate is a heat sink, and the first metal block is fixed and connected to an installation plane of the heat sink through the second filling material, wherein the second filling material is a thermal adhesive or an adhesive glue.

12. The power module assembly according to claim 1, wherein an electronic component disposed on the at least one plane has a maximum height relative to the at least one plane, and the at least one heat-generating device and the first filling material and the first metal block corresponding thereto have a total height equal to the maximum height.

13. The power module assembly according to claim 1, wherein the substrate is a system board, the at least one heat-generating device comprises a dual-side cooling switch device, and the dual-side cooling switch device is thermally and/or electrically connected to the system board through the first filling material, the first metal block and the second filling material.

14. A power module assembly comprising:

a circuit board comprising at least one plane;

at least one heat-generating device disposed on the at least one plane;

at least one first metal block comprising a first side and a second side, wherein the first side of the first metal block faces the at least one heat-generating device, and the second side of the first metal block faces a substrate, wherein each one of the at least one first metal block substantially thermally contacts a corresponding one of the at least one heat-generating device, wherein a projection of each one of the at least one first metal block on the at least one plane overlaps a projection of the corresponding heat-generating device on the at least one plane, and does not overlap a projection of another heat-generating device on the at least one plane;

a first filling material disposed between the first side of the first metal block and the at least one heat-generating device, and a second metal block comprising a first end and a second end, wherein the first end is connected to the at least one plane, the second end is flat and coplanar with the second side of the first metal block, and configured to connect to an installation plane of the substrate.

15. The power module assembly according to claim 14, further comprising a second filling material, wherein the second side of the first metal block and the second end of the second metal block are connected to the installation plane of the substrate through the second filling material.

16. The power module assembly according to claim 14, wherein a height difference formed between the second metal block and the at least one heat-generating device relative to the at least one plane is greater than 0.2 mm.

17. The power module assembly according to claim 14, wherein the first metal block has a height greater than 0.2 mm.

18. The power module assembly according to claim 14, wherein the substrate is a system board or a heat sink.

19. The power module assembly according to claim 14, wherein the at least one heat-generating device comprises two heat-generating devices, and the two heat-generating devices are dual-side cooling switch devices and commonly connected to the first metal block through the first filling material, wherein the first filling material is a thermal adhesive, an adhesive glue, a conductive glue or a solder.

20. The power module assembly according to claim 14, wherein the at least one heat-generating device comprises two heat-generating devices arranged adjacent to each other, the two heat-generating devices are dual-side cooling switch devices, one of the two heat-generating devices is electrically connected to the substrate through the first metal block, and the other of the two heat-generating devices is electrically connected to the substrate through another first metal block, wherein two of the first metal blocks have current in opposite directions.

\* \* \* \* \*